(12) United States Patent
Lin et al.

(10) Patent No.: US 8,276,758 B2
(45) Date of Patent: Oct. 2, 2012

(54) WAFER CONTAINER WITH AT LEAST ONE OVAL LATCH

(75) Inventors: Chin-Ming Lin, Tucheng (TW); Pao-Yi Lu, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 3 days.

(21) Appl. No.: 12/966,203

(22) Filed: Dec. 13, 2010

(65) Prior Publication Data

US 2011/0073521 A1    Mar. 31, 2011

Related U.S. Application Data

(63) Continuation-in-part of application No. 12/191,367, filed on Aug. 14, 2008, now Pat. No. 7,909,166.

(30) Foreign Application Priority Data

Aug. 12, 2010 (TW) ............................. 99126877 A

(51) Int. Cl.
*B65D 85/30* (2006.01)
*B65D 45/28* (2006.01)
(52) U.S. Cl. .................. 206/710; 206/454; 220/323
(58) Field of Classification Search .............. 206/454, 206/710, 711; 220/323–326; 292/32–37, 292/40–41
See application file for complete search history.

(56) References Cited

U.S. PATENT DOCUMENTS

| | | | |
|---|---|---|---|
| 4,995,430 A | 2/1991 | Bonora et al. | |
| 5,711,427 A | 1/1998 | Nyseth | |
| 5,915,562 A | 6/1999 | Nyseth et al. | |
| 5,931,512 A | 8/1999 | Fan et al. | |
| 5,957,292 A | 9/1999 | Mikkelsen et al. | |
| 6,622,883 B1 | 9/2003 | Wu et al. | |
| 6,736,268 B2 | 5/2004 | Nyseth et al. | |
| 6,880,718 B2 | 4/2005 | Eggum | |
| 6,902,063 B2 | 6/2005 | Pai et al. | |
| 7,168,587 B2 | 1/2007 | Eggum | |
| 7,182,203 B2 | 2/2007 | Burns et al. | |
| 7,971,723 B1 * | 7/2011 | Chiu et al. | 206/711 |
| 2005/0173296 A1 | 8/2005 | Hyobu et al. | |
| 2006/0283771 A1 | 12/2006 | Park | |
| 2010/0038281 A1 * | 2/2010 | Lin et al. | 206/710 |
| 2010/0038283 A1 * | 2/2010 | Chiu et al. | 206/711 |
| 2010/0065468 A1 * | 3/2010 | Chiu et al. | 206/711 |

\* cited by examiner

*Primary Examiner* — Bryon Gehman
(74) *Attorney, Agent, or Firm* — Ming Chow; Sinorica, LLC

(57) ABSTRACT

A wafer container includes a container body and a door joined with opening of the container body for protecting wafers therein. At least one latch component is disposed in the door, and each latch component includes an oval cam and a pair of moving bars, a first end of each moving bar connecting to one of the two opposite sides of the oval cam and a second end of each moving bar having a guiding structure, a pair of moving grooves being disposed between the first end and the second end of each moving bar, at least a pair of rollers being disposed on the door and each roller being embedded in each moving groove of moving bar, and a locating spring being formed as an integral part of the moving bars.

20 Claims, 17 Drawing Sheets

WAFER CONTAINER WITH AT LEAST ONE OVAL LATCH

The current invention is a continuation-in part of, and claims a priority to U.S. Ser No. 12/191,367 filed on Aug. 14, 2008, now U.S. Pat. No. 7,909,166.

The current application also claims a foreign priority to the application Taiwan, 099126877, filed on Aug. 12, 2010

BACKGROUND OF THE INVENTION

1. Field of the Invention

The present field of the invention is related to a wafer container, and more particularly, to a latch component disposed in door of wafer container.

2. Description of the Prior Art

The semiconductor wafers are transferred to different stations to apply the various processes in the required equipments. A sealed container is provided for automatic transfer to prevent the pollution from occurring during transferring process. FIG. 1 shows the views of wafer container of the conventional prior art. The wafer container is a front opening unified pod (FOUP) which includes a container body 10 and a door 20. The container body 10 is disposed with a plurality of slots 11 for horizontally supporting a plurality of wafers, and an opening 12 is located on a sidewall of the container body 10 for importing and exporting. Further, the door 20 includes an outer surface 21 and an inner surface 22, in which the door 20 is joined with the opening 12 of the container body 10 via inner surface 22 to protect the plurality of wafers within the container body 10. Furthermore, at least one latch hole 23 is disposed on the outer surface 21 of the door 20 for opening or closing the wafer container. According to the aforementioned, due to that wafers are placed in the container body 10 horizontally, thus, the FOUP needs a wafer restraint component to prevent the wafer from displacement or from movement toward the opening 12 of container body 10 occurring during the wafer transportation due to vibration.

FIG. 2 is a view of a front opening unified pod (FOUP) as described in U.S. Pat. No. 6,736,268. As shown in FIG. 2, the inner surface 22 of the door 20 is disposed with a recess 24 and the recess 24 is extended from the top 221 of the inner surface 22 to the bottom 222, and is located between two latch components 230 (inside of the door 20). A wafer restraint module (not shown in Figure) is further disposed in the recess 24. The wafer restraint module consists two wafer restraint components 100, and each wafer restraint component 100 includes a plurality of wafer contact heads 110 to sustain corresponding wafers, so as to prevent the wafer from displacement or movement toward the door opening due to vibration occurring in the wafer transportation procedure. However, the above-mentioned wafer restraint module is disposed on the recess 24 of the inner surface 22 of the door 20, and the wafer is merely attached to the inner surface 22 of the door 20 or the wafer is partially settled down within the recess 24. The wafers either sit adjacent to the inner surface 22 of the door 20 or only slightly enter into the recess 24. As a result, the wafers are not securely and fully settled into the recess 24 and the length between the front side and the back side of the FOUP is not effectively shortened. In addition, the tiny dust particles generated due to the friction between the wafer restraint module and the wafers can be easily accumulated in the recess 24. In the process of cleaning the accumulated dust particles, it is necessary to separate the wafer restraint module from the recess 24 on the inner surface 22 of the door 20. By frequent separation and assembly of the wafer restraint module in order to apply the cleaning process, the wafer restraint module is easily slackened.

Furthermore, FIG. 3 is a view of latch component 230 in door 20 of a front opening unified pod (FOUP) as described in U.S. Pat. No. 5,711,427. The method for assembling the door 20 and container body 10 is mainly to dispose a movable bolts 231 on the two sides of door 20 (namely between outer surface 21 and inner surface 22) and to dispose socket holes (not shown in Figure) adjacent to the edge of opening of door 10 and corresponding to bolts 231. The objective of fixing the door 20 in the container body 10 can thus be achieved with the turning of latch hole disposed on outer surface 21 of door 20 and the inserting of latch bolts 231 into socket holes, in which the insertion and withdrawal of latch bolts 231 are controlled by the turning of latch hole via a round-shaped cam 232.

And in the operating practice of semiconductor factory, the opening of FOUP is mainly operated through a wafer carrying apparatus (not shown in Figure). The wafer carrying apparatus includes at least one opening latch (not shown in Figure) that is to be inserted into the latch hole 23 on outer surface 21 of door 20 of the FOUP and to turn cam 232 to drive the movable bolts 231 to open or close the FOUP.

In addition, other U.S. patents that describe latch component in door of FOUP include U.S. Pat. Nos. 5,915,562, 5,957,292, 6,622,883, and 6,902,063. In order to achieve air tightness when joining door and container body, movable bolts will shift longitudinally for fastening a springy air-tight component, which leads to achievement of both objectives of closing FOUP and air tightness. However, in prior latch patents, complex mechanic apparatuses are used, the usage of which not only results in higher failure rate but also generates too much mechanical friction in the operating process that pollutes wafers. Moreover, the air tightness achieved by fastening springy air-tight component with shift of movable bolts cannot sustain for very long time and is not effective enough.

Moreover, in conventional FOUP, some restraint components are disposed on the inner surface of door 20. Thus, when door 20 closes container body 10, the restraint components contact wafers and completely fix the wafers in order to prevent displacement of wafers in FOUP from happening during transportation procedure. And in order to avoid too forcible collision or friction between restraint components and wafers when contacting, therefore, as shown in FIG. 4, a few U.S. patents disclose springy component 86 that is disposed between cam 232 in latch component 230 and door 20. In the process in which cam 232 turns and drives movable bolts 231 to close FOUP, this springy component 86 can function as damping for restraint component disposed on inner surface of door 20 to contact wafers under mitigated and smooth condition, and thus the problem of collision and friction can be solved. These U.S. patents include U.S. Pat. Nos. 6,880,718, 7,168,587, and 7,182,203. However, in this way of laterally driving, it is easy for an offsetting force to generate on the moving direction of movable bolts 231 and cause failure of insertion of movable bolts into socket holes of container body 10. Thus, container body 10 and door 20 cannot be closed, and the production cost of FOUP is also increased.

SUMMARY OF THE INVENTION

In door component of front opening unified pod (FOUP) of prior art, the latch component is composed of complex mechanic apparatus, which not only leads to higher failure rate but also generates too much mechanic friction in the operating process that may lead to pollution of wafer. One objective of the present invention is thus to provide a front opening unified pod (FOUP) disposed with latch component with oval cam so that the moving bars can move to and fro on only one plane surface and the latch component can also be simplified.

Another objective of the present invention is to provide a front opening unified pod (FOUP) disposed with latch component with oval cam, wherein with the design of roller, the moving bars can be driven by the oval cam to move to and fro on only one plane surface, the design of which reduces friction generated in the moving process of moving bars and also reduces pollution.

Still another objective of the present invention is to provide a front opening unified pod (FOUP) disposed with latch component with oval cam, in which a recess is formed between latch components for wafers to be fully and effectively filled in the space of the recess. This makes it possible for the length between the front side and the back side of the FOUP to be shortened, and also for the center of gravity to be more focused on the central part of wafer container to make the wafer container more stable.

In order to achieve the aforementioned objectives, the present invention discloses a wafer container, which comprises a container body, in the interior of which a plurality of slots are disposed for supporting a plurality of wafers and on one sidewall of which an opening is formed for importing and exporting the plurality of wafers, at least a pair of socket holes being adjacently disposed in the edge of opening of the container body, and a door, which includes an outer surface and an inner surface and is joined with opening of container body via its inner surface for protecting wafers therein, at least a pair of latch holes being adjacently disposed in the edge of door and corresponding to each pair of socket holes, the characteristic in that: each socket hole in the edge of the container body has an inner groove with an inclined surface for forming an externally wide and internally narrow groove structure, a recess is disposed on the inner surface of the door and is located between two platforms, and a latch component is disposed in each platform and includes an oval cam and a pair of moving bars, a first end of each moving bar connecting to one of the two opposite sides of the oval cam and a second end of each moving bar having a guiding structure, a pair of moving grooves being disposed between the first end and the second end of each moving bar, at least a pair of rollers being disposed in the platform and each roller being embedded in each moving groove of moving bar, and a locating spring being formed as an integral part of the moving bars for controlling the turning of oval cam to drive each moving bar to move to and fro between each pair of socket hole and latch hole.

The present invention then discloses a wafer container, which comprises a container body, in the interior of which a plurality of slots are disposed for supporting a plurality of wafers and on one sidewall of which an opening is formed for importing and exporting the plurality of wafers, at least a pair of socket holes being adjacently disposed in the edge of opening of the container body, and a door, which includes an outer surface and an inner surface and is joined with opening of container body via its inner surface for protecting wafers therein, at least a pair of latch holes being adjacently disposed in the edge of door and corresponding to each pair of socket holes, the characteristic in that: each socket hole in the edge of the container body has an inner groove with an inclined surface for forming an externally wide and internally narrow groove structure, at least one latch component is disposed between the outer surface and the inner surface of the door, and each latch component includes an oval cam and a pair of moving bars, a first end of each moving bar connecting to one of the two opposite sides of the oval cam and a second end of each moving bar having a guiding structure, a pair of moving grooves being disposed between the first end and the second end of each moving bar, at least a pair of rollers being disposed between the outer surface and the inner surface of the door and each roller being embedded in each moving groove of moving bar, and a locating spring being formed as an integral part of the moving bars for controlling the turning of oval cam to drive each moving bar to move to and fro between each pair of socket hole and latch hole.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a wafer container having a container body and a door, in which a plurality of slots are disposed in the container body for supporting a plurality of wafers and an opening is formed on one sidewall of the container body for importing and exporting the plurality of wafers, the door being joined with the opening of the container body via the inner surface of the door for protecting the plurality of wafers in the container body. In addition, at least a latch hole is disposed on the outer surface of the door for opening or closing the wafer container. The structures of wafer container utilized in the present invention are the same as those described above and the complete description of detailed manufacturing or operating processes is thus omitted in the following. And drawings referred to in the following description are not completely drawn according to the actual scale and only serve the function of illustrating characteristics related to the present invention. In addition, in order to disclose technological contents, objectives, and achieved effects of the present invention more clearly and completely, drawings with accompanying signs are constantly referred to in the following description.

Figure 5:
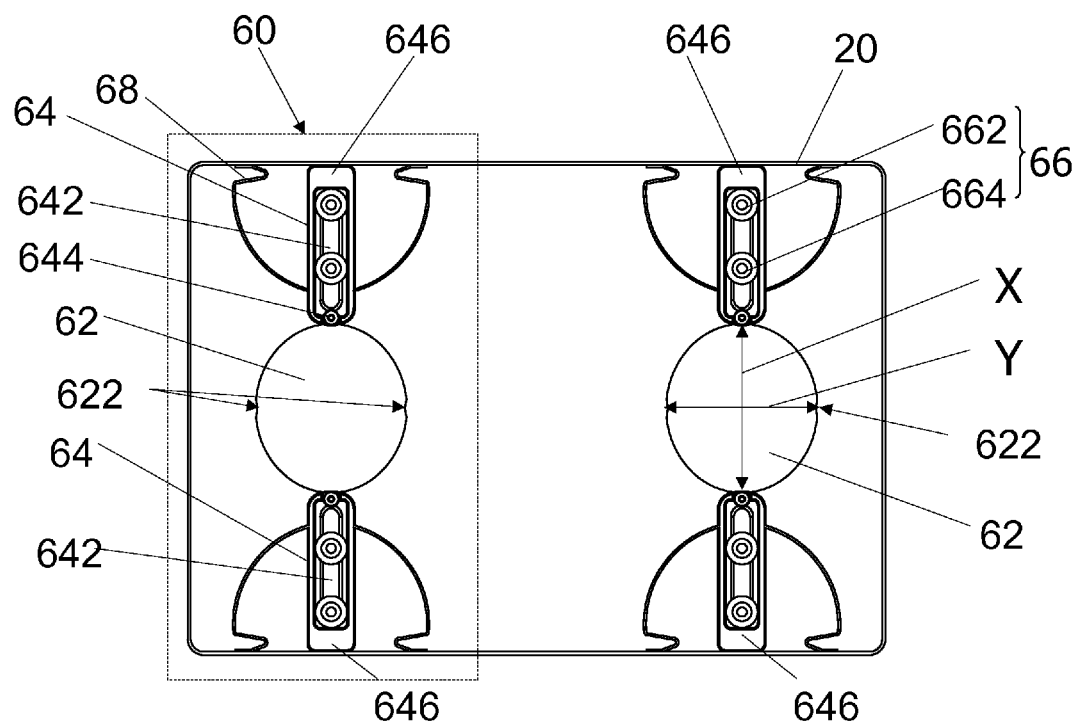
FIG. 5 is a view of the door of a front opening unified pod (FOUP) of the present invention.
Figure 6:
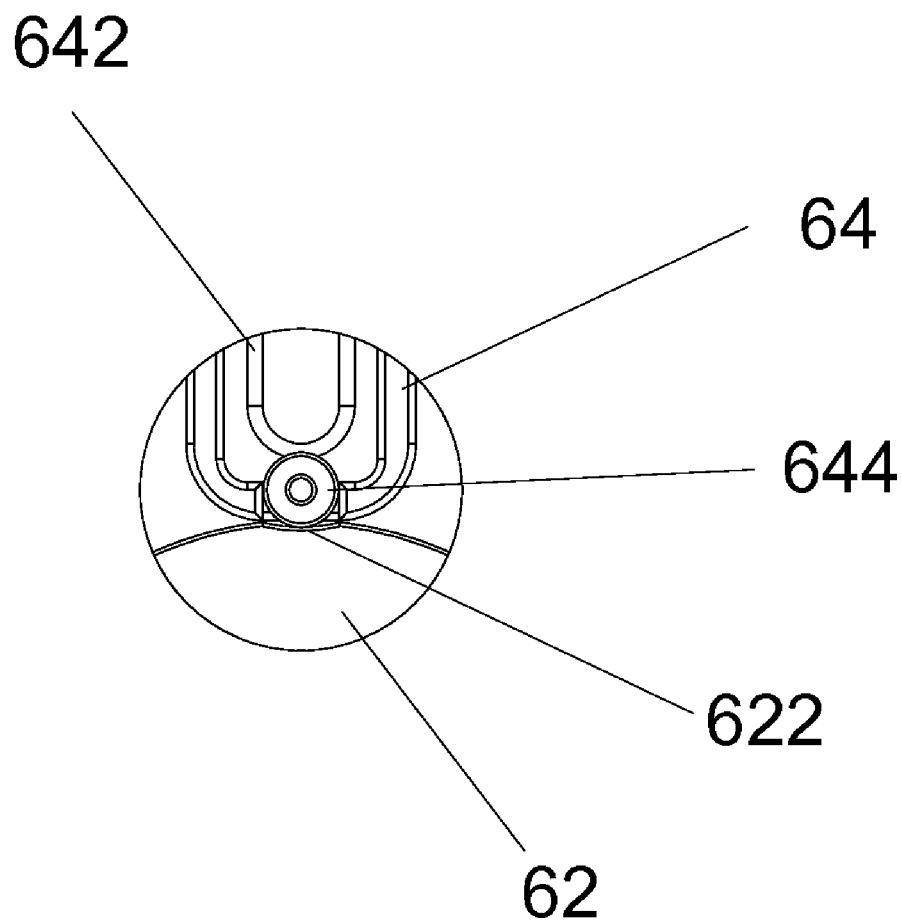
FIG. 6 is part of a magnified view of the latch component in FIG. 5 of the present invention.

Referring to FIG. 5, which is a top view of latch component 60 in door 20 of front opening unified pod (FOUP) of the present invention. As shown in FIG. 5, a pair of latch components 60 are located between outer surface and inner surface of door 20, in which each latch component 60 is composed of an oval cam 62, a pair of moving bars 64 are contacting two ends of oval cam 62, at least one roller 66 disposed between outer surface and inner surface of door 20 and fixed in slide groove 642 of the moving bars 64, and a locating spring 68 being an integral part of the moving bars 64. Then referring to FIG. 6, which is a magnified view of two ends of oval cam 62 that contact moving bars 64. As shown in FIG. 6, in a preferred embodiment of the present invention, a locating roller 644 can be further disposed where moving bars 64 contacting two ends of oval cam 62. When the oval cam 62 turned, the force of friction between moving bars 64 and oval cam 62 can be reduced. Moreover, with the design of a plurality of locating grooves 622 on oval cam 62, when the oval cam 62 turns, locating rollers 644 can slide smoothly into locating groove 622 as point of restriction for the turning oval cam 62. In this preferred embodiment of the present invention, the oval cam 62 can be made of metal or polymer plastic material, which is not limited in the present invention.

Figure 7A:
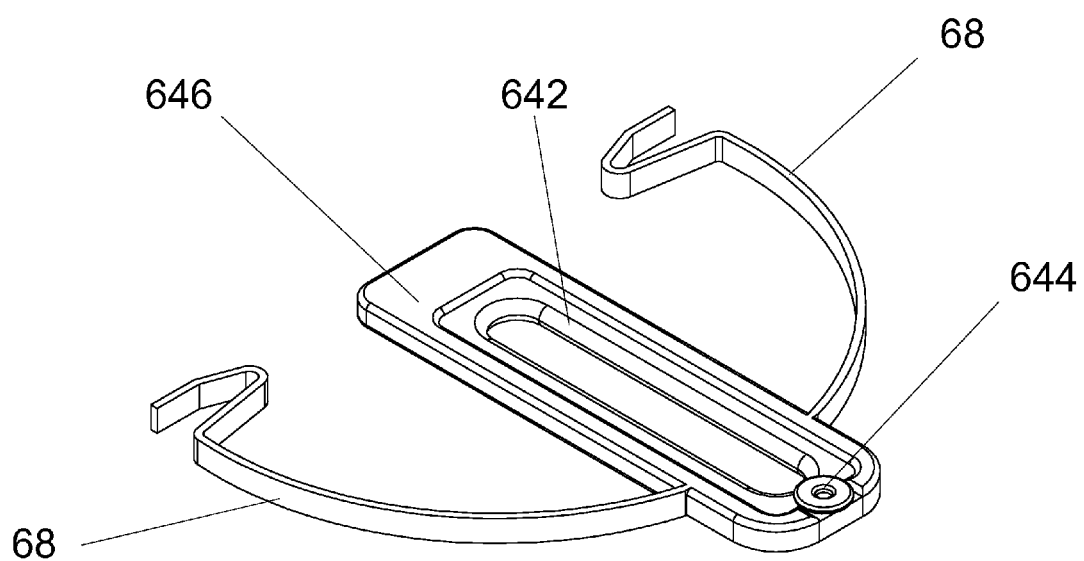
FIG. 7A to FIG. 7C are magnified views of the moving bars of the latch component of the present invention.

In the following, referring to FIGS. 7A-7C, which are views of moving bars 64 of latch component 60 of the present invention. On one end of moving bars 64 is disposed with a locating roller 644, and on the opposite end is a physical plane surface 646. Between the two ends of a slide groove 642 is formed with roller 66 that fastened in door 20 and fixed in it. Moreover, the end of moving bars 64 that is near to locating rollers 644 is connected with one end of locating spring 68, and the other end of locating spring 68 is fixed on door 20. Therefore, when the door 20 is to close the opening 12 of container body 10, door 20 and container body 10 are first joined and then oval cam 62 is turned; when oval cam 62 turns, the moving bars 64 are pushed by oval cam 62 toward the edge of door 20. Thus physical plane surface 646 of moving bars 64 is allowed to go through latch hole 27 of door 20 and extends into socket hole (not shown in Figure) located near the edge of opening of container body 10 and corresponding with latch hole 27, and container body 10 and door 20 can thus be joined into one and the closing procedure of container body 10 is thus completed. Meanwhile, locating spring 68 is compressed, and thus when door 20 is about to be opened, with the turning of oval cam 62, a force of locating spring 64 generated according to Hooke's law will also drive moving bars 64 to resume to the location in opening status. In preferred embodiment of the present invention, moving bars 64 and locating spring 68 can be made of metal or polymer plastic material, which is not limited in the present invention; the material of roller 66 is not limited either in the present invention.

Figure 7B:
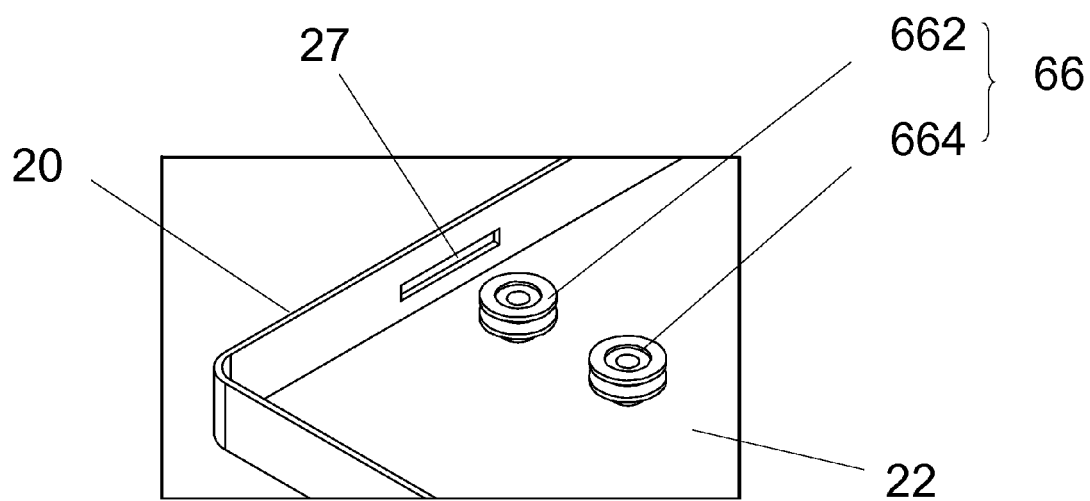
Figure 7C:
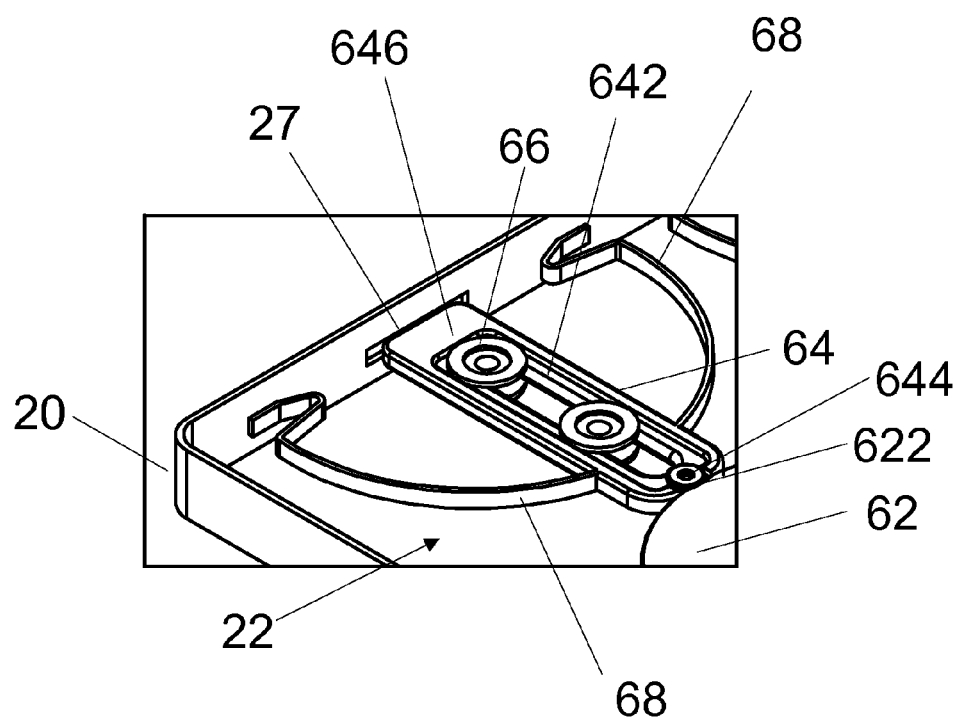

Moreover, as shown in FIG. 7B, in a preferred embodiment, rollers 66 are disposed in pair in door 20 and each of the pair of rollers is at a proper distance from the other. Therefore, when roller 662 and roller 664 are fixed in slide groove 642 of moving bars 64, this pair of rollers 66 can accurately and smoothly guide plane surface 646 of moving bars 64 through latch hole 27 located on door 20.

Figure 8:
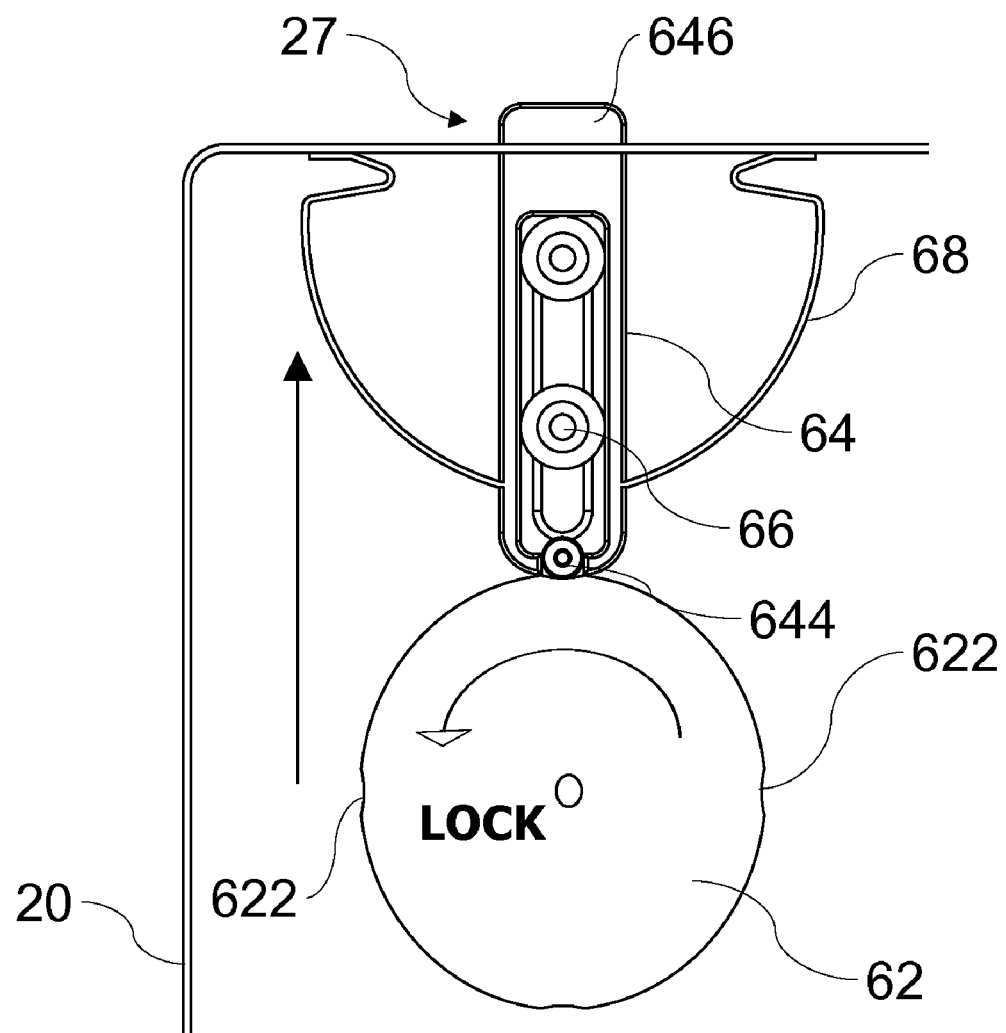
FIG. 8 is a view of the latch component of the present invention in closing status.

What is to be emphasized here is that, in the process of the present invention described above, an oval cam 62 and moving bars 64 are used to describe the operating procedures of latch component 60, but actually each oval cam 62 is in contact with a pair of moving bars 64, and in each door 20 is disposed with a pair of latch component 60 (as shown in FIG. 5, in which door 20 of the present invention is in opening status). Due to that the cam in latch component 60 of the present invention is an oval cam 62, which forms a pair of latch holes (not shown in Figure) on the outer surface 21 of door 20. Since oval cam 62 has a longer radius Y and a shorter radius X, in the present invention the difference between two different radiuses of oval cam 62 is used as starting component for controlling the to and fro movement of moving bars 64. For example, for moving bars 64 to move up or down along two lateral sides of door 20 for 10 mm~30 mm in order to let front end of moving bars 64 go through door 20, the length difference between longer radius and shorter radius of oval cam 62 should be no less than 10 mm~30 mm. Due to that the two ends of shorter radius of oval cam 62 are in contact with a pair of moving bars 64 located on two ends when door 20 opens, apparently, when door 20 closes container body 10, the moving bars 64 on two ends can be made to contact longer radius of oval cam 62 by turning oval cam 62. Since the different in length between longer radius and shorter radius of oval cam 62 should be no less than 50 mm, therefore when oval cam 62 turns to a locating groove 622 located on longer radius Y, front plane surface 646 of moving bars 64 can be made to go through latch hole 27 on door 20, as shown in FIG. 8. What is to be emphasized here is that as moving bars 64 are connected to one end of locating spring 68 near the end of locating roller 644, and the other end of locating spring 68 is fixed to door 20, therefore when oval cam 62 turns to locating groove 622 located on longer radius Y, moving bars 64 will be pushed by oval cam 62 toward latch hole 27 on the edge of door 20. At this time, locating spring 68 will be compressed, and thus when door 20 is about to be opened, with oval cam 62 turning to locating groove 622 located on shorter radius X, a force generated according to Hooke's law of locating spring 68 will also drive moving bars 64 to resume to the location in opening status (i.e. oval cam 62 stays at locating groove 622 located on shorter radius X).

Figure 1:
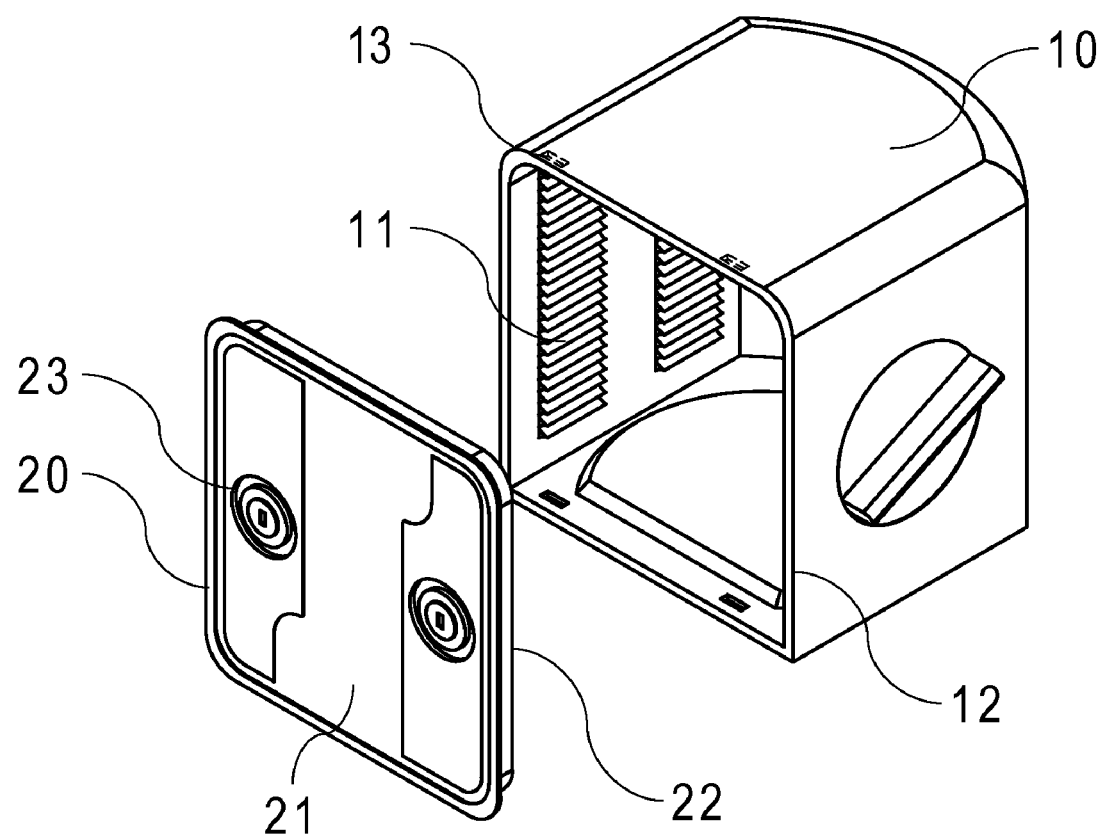
FIG. 1 is a view of the front opening unified pod (FOUP) of the prior art.
Figure 2:
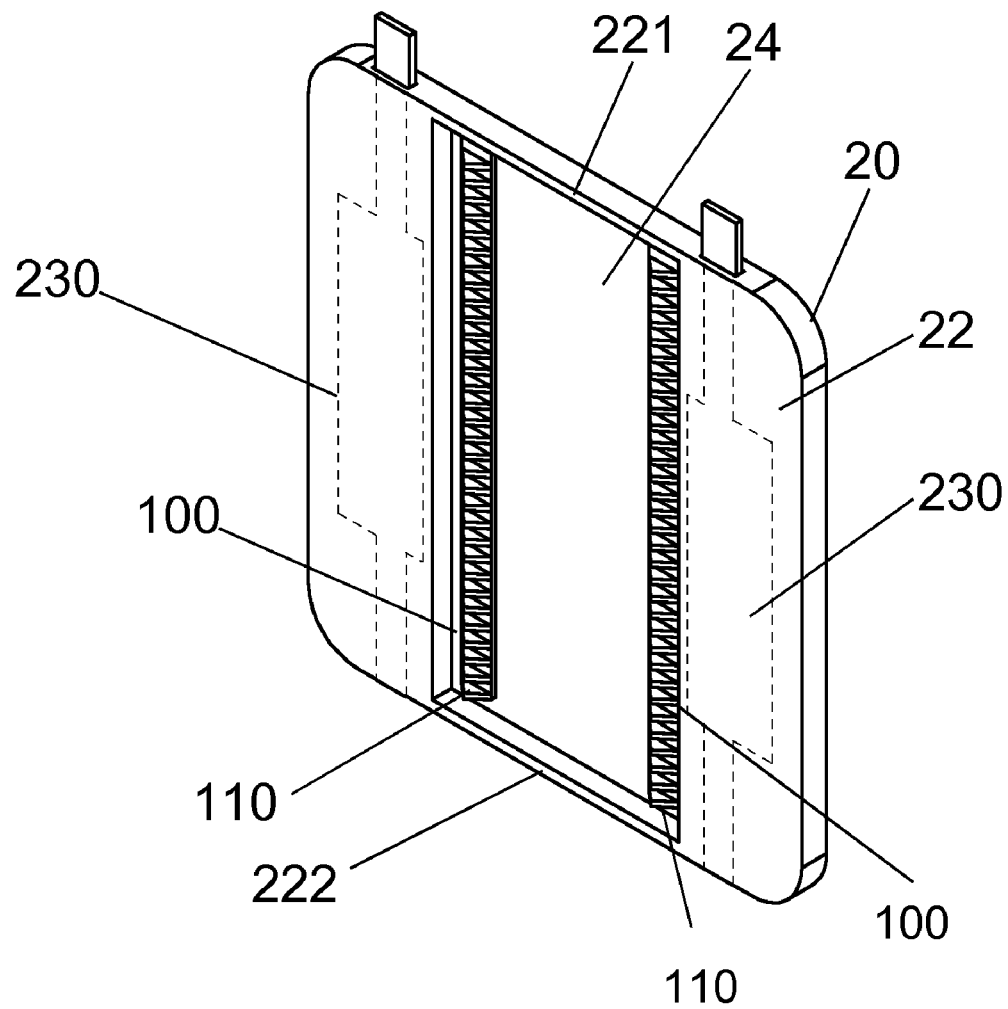
FIG. 2 is a view of the door of the front opening unified pod (FOUP) of the prior art.
Figure 3:
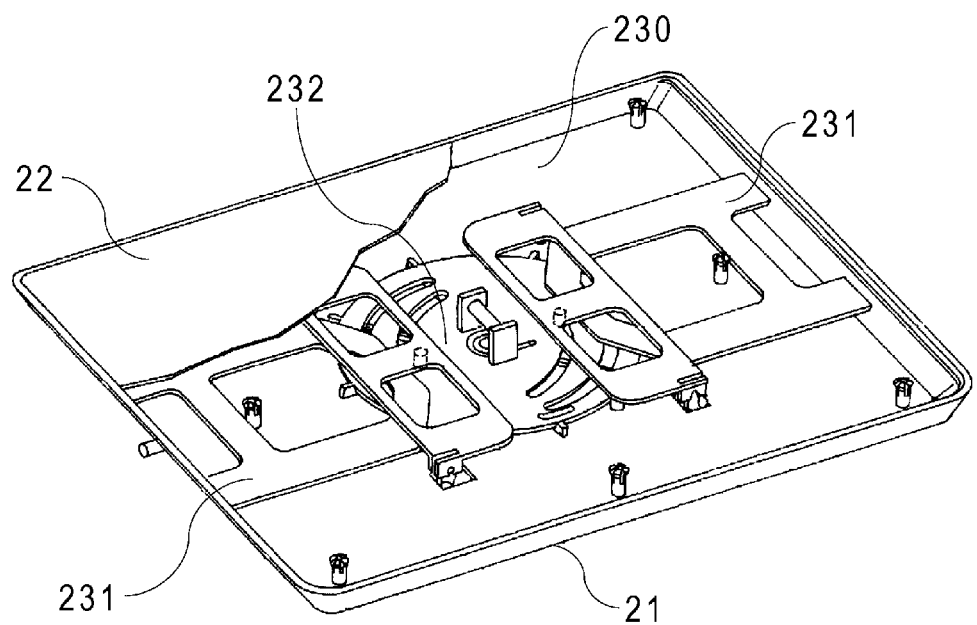
FIG. 3 is a view of another door of front opening unified pod (FOUP) of the prior art.
Figure 4:
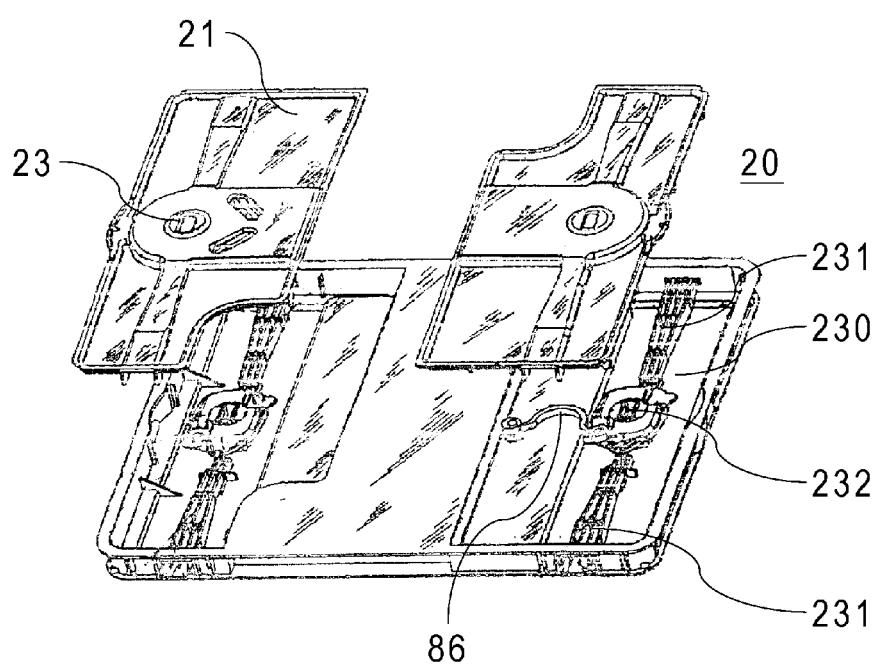
FIG. 4 is a view of still another door of front opening unified pod (FOUP) of the prior art.

Obviously, when driven by oval cam 62, the latch component 60 of the present invention can only make to-and-fro movement, moving forward and backward, and no shift will occur on the longitudinal (vertical) direction. Therefore, the latch component 60 of the present invention is a simpler design. When door 20 and container body of the present invention close, the plurality of wafer restraint components (not shown in Figure) fixed on inner surface 22 of door 20 directly contact wafers. A pair of moving bars 64 are driven by cam 62 to move toward the edge of door 20, which makes front plane 646 of moving bars 64 go through latch hole 27 (as shown in FIG. 8) on door 20 and be fastened in socket hole 13 (as shown in FIG. 1) corresponding to latch hole 27 near the edge of opening of container body 10. Then, an aeration device can be disposed for aerating air-tight component (not shown in Figure) between door 20 and container body 10 to isolate interior from exterior of container body 10.

Then, please refer to FIG. 9 to FIG. 13A and FIG. 13B, which is a top view of the latch component in the door of wafer container of another preferred embodiment of the present invention. The basic structure of the wafer container, as previously described and illustrated in FIG. 1, comprises a container body 10 and a door 20. The container body 10 is disposed with a plurality of slots 11 for horizontally supporting a plurality of wafers, and an opening 12 is located on a sidewall of the container body 10 for importing and exporting the wafers. Furthermore, the door 20 includes an outer surface 21 and an inner surface 22 and is joined with the opening 12 of the container body 10 via inner surface 22 to protect the plurality of wafers within the container body 10. In addition, at least a latch hole 23 is disposed on the outer surface 21 of the door 20 for opening or closing the wafer container. In the present embodiment, what is to be disclosed is another kind of latch component disposed in the door 20, as shown in FIG. 9 to FIG. 13A and FIG. 13B.

Figure 13A:
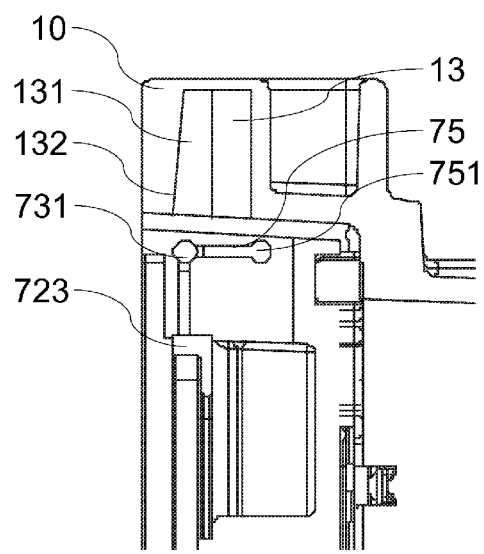
FIG. 13A and FIG. 13B are side views of the guiding structure of the present invention.

First, referring to FIG. 13A, each socket hole 13 on the container body 10 has an inner groove 131, and each inner groove 131 includes an inclined surface 132 for the inner groove 131 to be formed as an externally wide and internally narrow structure.

Figure 9:
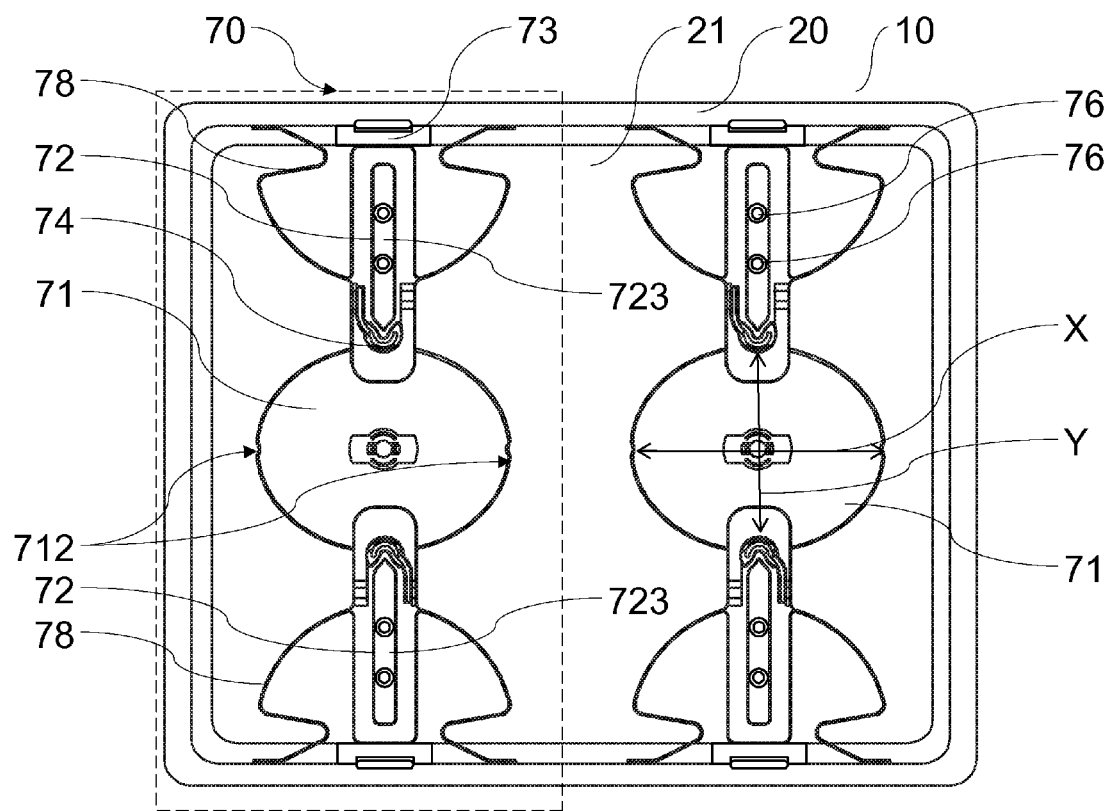
FIG. 9 is a view of the door of yet another front opening unified pod (FOUP) of the present invention.

Then, referring to FIG. 9, which is a view of the door of another wafer container of the present invention. As shown in FIG. 9, each latch component 70 comprises an oval cam 71, a pair of moving bars 72, a first end 721 of each moving bar 72 connecting to one of the two opposite sides of the oval cam 71 and a second end 722 of each moving bar 72 having a guiding structure 73, a pair of moving grooves 723 being disposed between the first end 721 and the second end 722, at least a pair of rollers 76 being disposed between the outer surface 21 and the inner surface 22 of the door 20 and each roller 76 being embedded in each moving groove 723 of moving bar, and a locating spring 78, which is formed as an integral part of the moving bars 72. Apparently, each aforementioned latch component 70 is disposed between the outer surface 21 and the inner surface 22 of the door 20.

Figure 10:
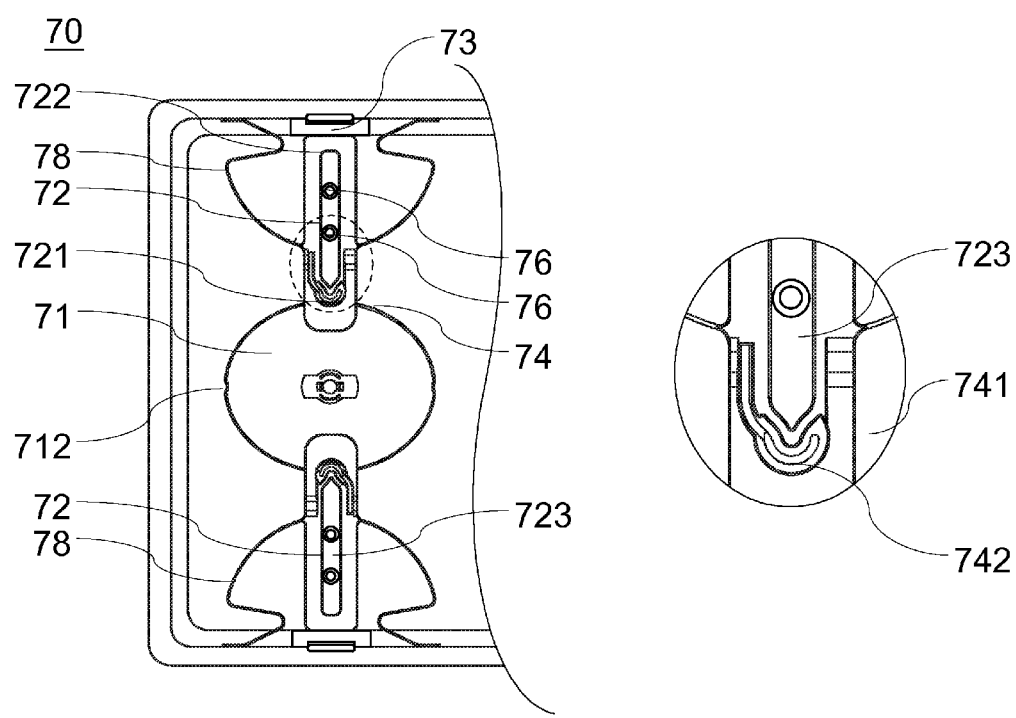
FIG. 10 is a view of a latch component of the present invention.

Then, referring to FIG. 10, which is a magnified view of the sides of oval cam in contact with the moving bars shown in FIG. 9. As shown in FIG. 10, in the present embodiment, a first end 721 of each moving bar 72 contacts one of the two opposite sides of the oval cam 71, and a locating structure 74 is disposed at the place where the first end 721 of each moving bar 72 contacts the oval cam 71. The locating structure 74 is an integral part of the moving bars 72 and is manufactured by injection molding, wherein the locating structure 74 is a hollowed-out spring structure 741 which includes a locating portion 742 protruding from the spring structure 741. Furthermore, a plurality of locating grooves 712 are disposed on the oval cam 71, and the shape of the locating grooves 712 can be U-shaped or V-shaped. When the oval cam 71 turns, the locating portion 742 of the locating structure 74 is engaged with the locating grooves 712 of the oval cam 71 for providing the functions of automatic aligning, locating, and stopping and thus serves as point of restriction when the oval cam 71 turns. In the present embodiment, the oval cam 71 can be made of metal or polymer plastic material, and the material of the oval cam 71 is not limited in the present invention.

Then, referring to FIG. 10, a first end 721 of each moving bar 72 is disposed with a locating structure 74 and a second end 722 of each moving bar 72 has a guiding structure 73, and a pair of moving grooves 723 is formed between the first end 721 and the second end 722 of the moving bars 72 and can be engaged with the rollers 76 fastened in the door 20. Moreover, one end of the locating spring 78 is fastened on the door 20 and another end of the locating spring 78 is connected to the end of the moving bars 72 close to the locating structure 74.

Figure 11:
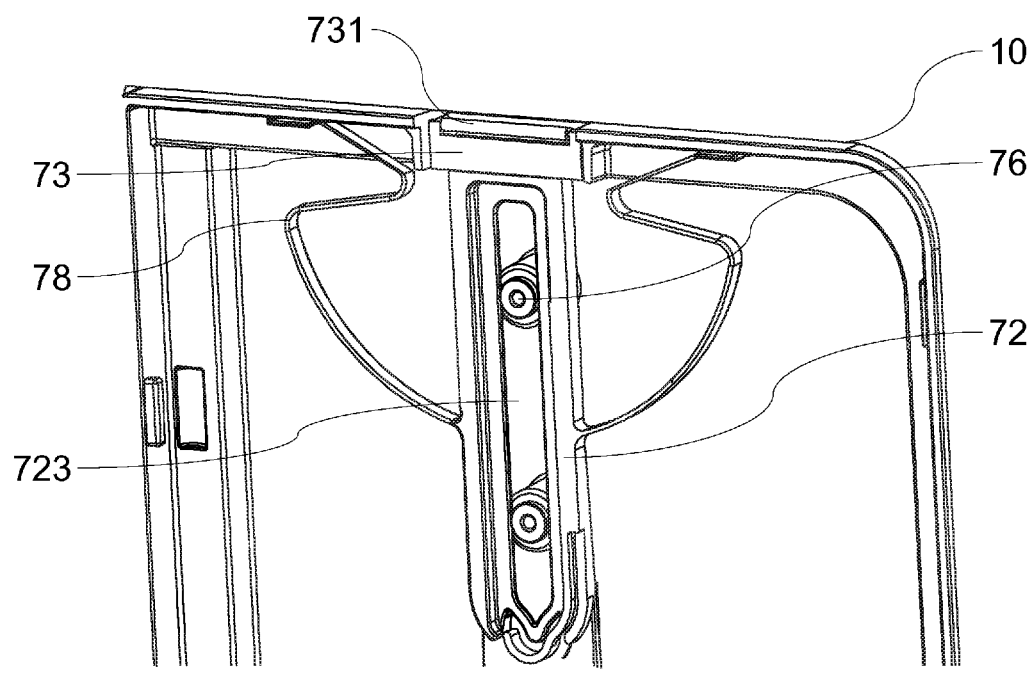
FIG. 11 is a view of a guiding structure of the present invention.
Figure 12A:
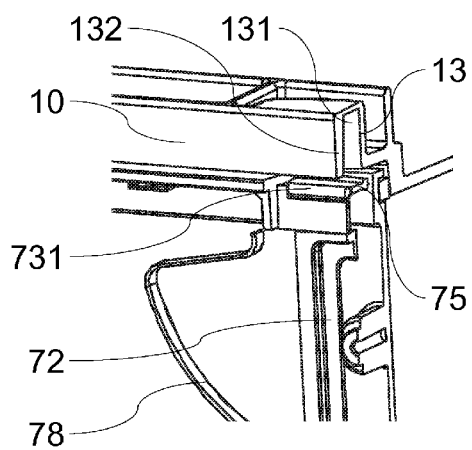
FIG. 12A is a sectional view of the latch component of the present invention in opening status.
Figure 12B:
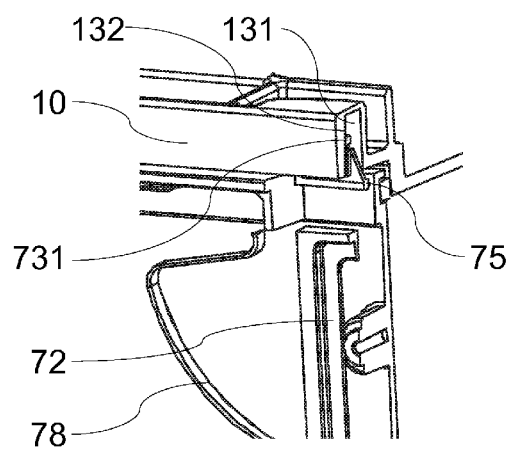
FIG. 12B is a view of the latch component of the present invention in closing status.
Figure 13B:
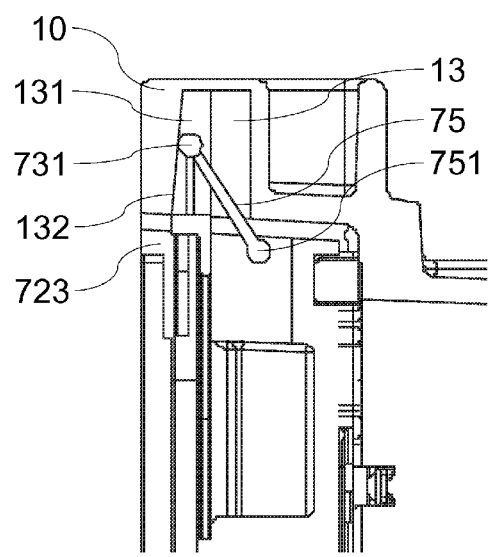

Then, referring to FIG. 11, which is a view of the guiding structure of latch component of the present invention. As shown in FIG. 11, the guiding structure 73 is disposed on the second end 722 of the moving bars 72. The guiding structure 73 is a roller structure 731, a bar-shaped roller for example. Referring then to FIG. 12A, a top pressing piece 75 is further pivotally disposed between the outer surface 21 and the inner surface 22 of the door 20. This top pressing piece 75 is a piece body and its shape is generally rectangular, and the rectangular piece body includes a pivotal portion 751 on its longer side. The top pressing piece 75 is fastened in the door 20 via its pivotal portion 751, and the pivotally disposed top pressing piece 75 and the roller structure 731 are relatively located as corresponding to and perpendicular to each other, wherein the top pressing piece 75 is formed with polymer plastic material. Thus, by controlling the turning of the oval cam 71, each moving bar 72 is made to move to and fro between each pair of socket hole 13 and latch hole 27. Therefore, when the door 20 is to close the opening 12 of the container body 10, the door 20 and the container body 10 are first joined, as shown in FIG. 12A and FIG. 13A, and at this moment, the moving bars 72 have not started moving since the roller structure 731 and the top pressing piece 75 are still relatively located as corresponding to and perpendicular to each other; when the oval cam 71 turns, the moving bars 72 are driven by the oval cam 71 to move toward the edge of the door 20 for the roller structure of the moving bars 72 to go through the latch hole 27 on the door 20 (as shown in FIG. 8) and extend into the socket hole 13 on the edge of the opening of the container body 10 (as shown in FIG. 1), the container body 10 and the door 20 being joined together and the action of closing the container body 10 being thus completed. Wherein, when the roller structure 731 extends into the socket hole 13, the roller structure 731 moves along the inclined surface 132 of the inner groove 131, and since the structure of inner groove 131 is externally wide and internally narrow, the moving bars 72 are made to displace toward the container body when the roller structure 731 moves and thus a force pressing from the door 20 toward the container body 10 is generated for the door 20 and the container body 10 to be tightly joined together. Also, the roller structure 731 and the top pressing piece 75 are in contact with each other due to the moving bars 72; when the roller structure 731 moves, the top pressing piece 75 is also driven to turn, and the turning of the top pressing piece 75 is restricted by the opening of the inner groove 131 and the roller structure 731 is thus stopped from moving. The included angle between the roller structure 731 and the top pressing piece 75 is originally a right angle but becomes an acute angle when the roller structure 731 moves; for example, when the roller structure 731 moves for about 10 mm~15 mm on the inclined surface 132, the included angle becomes an acute angle of around 40~60 degrees, as shown in FIG. 12B and FIG. 13B. However, when the roller structure 731 moves to the bottom of the inner groove 131, due to the inclined surface 132 of the inner groove 131 and gravity, the roller structure 731 moves in the direction opposite to that in which the moving bars 72 move, and at this moment, since the moving bars 72 still exert a force that presses toward the container body 10 and are in contact with the top pressing piece 75, the top pressing piece 75 is thus able to provide a sustaining force that stops the moving bars 72 from moving and fastens the roller structure 731 to the inner groove 131. And as the container body 10 and the door 20 are joined together, the locating spring 78 is compressed, as shown in FIG. 10, and therefore when the door 20 is about to be opened, with the turning of the oval cam 71, a force of locating spring 78 generated according to Hooke's law will also drive moving bars 72 to resume to the location in opening status. In preferred embodiment of the present invention, moving bars 72 and locating spring 78 can be made of metal or polymer plastic material, which is not limited in the present invention; the material of roller 76 is not limited either in the present invention.

Figure 14:
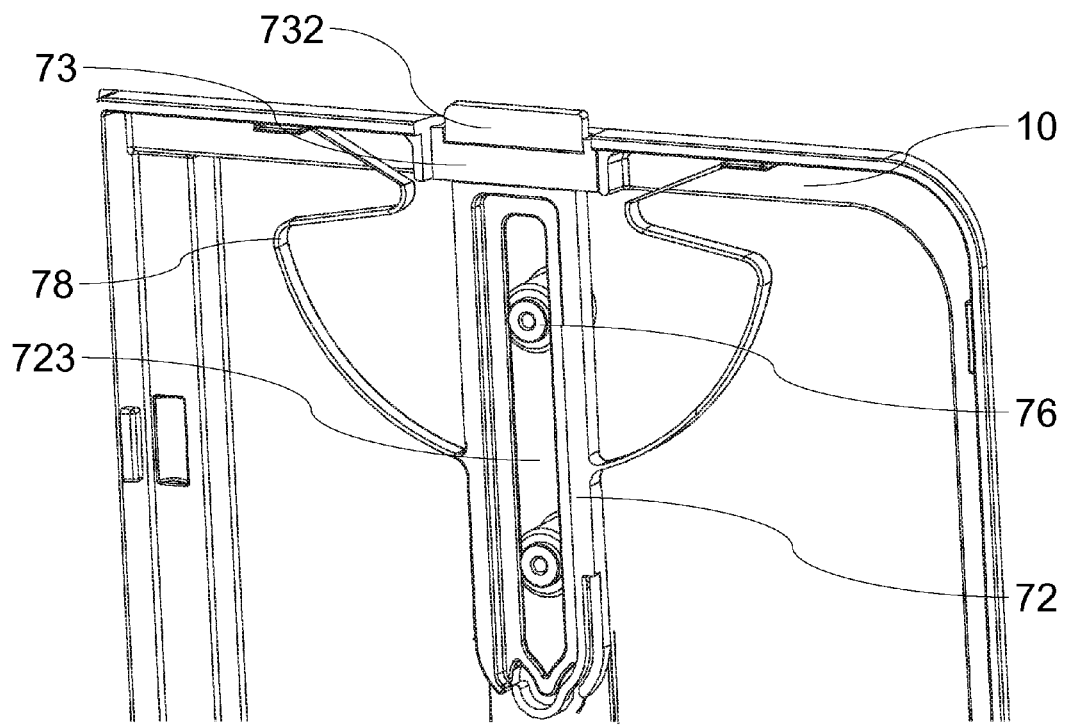
FIG. 14 to FIG. 15B are views of another latch component of the present invention in opening and closing statuses.
Figure 15A:
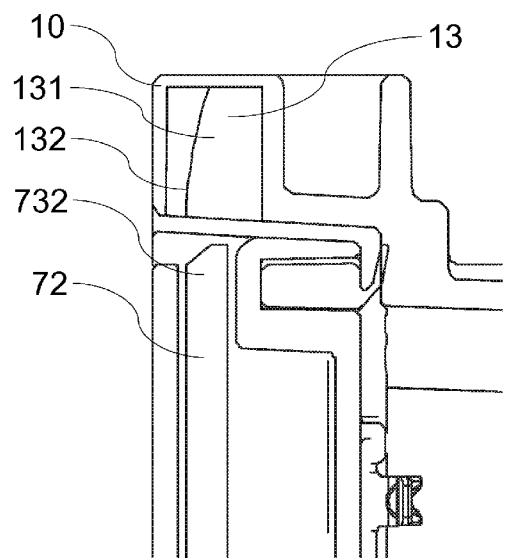
Figure 15B:
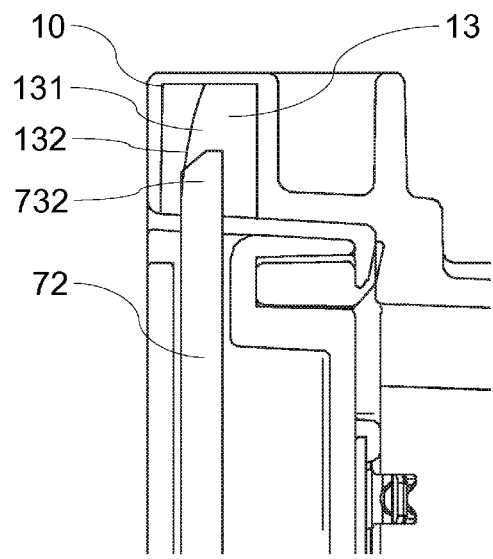

Then, referring to FIG. 14, which is a view of another embodiment of the guiding structure of latch component of the present invention. The guiding structure 73 is disposed on the second end 722 of the moving bars 72 and has a burnished curved surface 732; the inclined surface 132 in the socket hole 13 is curved and such structure provides the portions in contact with other components with properties of low wear and low resistance, as shown in FIG. 15A. By controlling the turning of the oval cam 71, each moving bar 72 is made to move to and fro between each pair of socket hole 13 and latch hole 27. When the door 20 is to close the opening 12 of the container body 10, the door 20 and the container body 10 are first joined, as shown in FIG. 15A, and at this moment, the moving bars 72 have not started moving; when the oval cam 71 turns, the burnished curved surface 732 of moving bars 72 is driven by the oval cam 71 to move toward the edge of the door 20 for going through the latch hole 27 on the door 20 and then extending into the socket hole 13 on the edge of the opening of the container body 10, the container body 10 and the door 20 being joined together and the action of closing the container body 10 being thus completed. Wherein, when the burnished curved surface 732 extends into the socket hole 13, the burnished curved surface 732 moves along the inclined surface 132 of the inner groove 131, and since the structure of inner groove 131 is externally wide and internally narrow and the inclined surface 132 is curved, the moving bars 72 are made to displace toward the container body when the burnished curved surface 732 moves and thus a force pressing from the door 20 toward the container body 10 is generated for the door 20 and the container body 10 to be tightly joined together. Also, due to movement of the moving bars 72, a force pressing from the moving bars 72 toward the container body 10 still exists and functions to fasten the burnished curved surface 732 in the inner groove 131, as shown in FIG. 15B. In a preferred embodiment of the present invention, moving bars 72 and guiding structure 73 are made of different materials, wherein the guiding structure 73 is made of polymer plastic material such as PEEK or Teflon that has the properties of good wear and abrasion resistance.

The structure of latch component 70 of the present invention is about the same as that described previously, in which the oval cam 71 and the moving bars 72 are utilized in correspondent operation for the moving bars 72 to move to and fro between the socket holes 13 and the latch holes 27, and the detailed embodiment is thus the same as what is previously described and is therefore omitted herein.

According to what is described above, in addition to the deployment between the outer surface 21 and the inner surface 22 of the door 20, the latch component 70 can also be disposed in the two platforms 25 on the inner surface 22 of the door 20 and related structural deployment is the same as what is described above and detailed description is thus omitted. Furthermore, the latch component 70 disclosed here by the present invention is also the same as that described above and the description is thus omitted. One thing to be noticed is that in the present embodiment, the top pressing piece 75 is pivotally disposed in each platform 25 of the door 20; related operating process is also the same as that described above and the description is also omitted.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container, comprising a container body, in which a plurality of slots being disposed in said container body for supporting a plurality of wafers and an opening being formed on one sidewall of said container body for importing and exporting said plurality of wafers, at least a pair of socket holes being disposed in an edge of said opening of said container body, and a door, having an outer surface and an inner surface, at least a pair of latch holes being disposed in an edge of said door and corresponding to said pair of socket holes, said door being joined with said opening of said container body via said inner surface for protecting said plurality of wafers therein, the characteristic of said wafer container in that:

each of said pair of socket holes in said edge of said opening of said container body has an inner groove with an inclined surface for forming an externally wide and internally narrow groove structure, a recess is disposed on said inner surface of said door and is located between two platforms, and a latch component is disposed in each of said platforms, said latch component including an oval cam and a pair of moving bars, a first end of each of said moving bars connecting to one of two opposite sides of said oval cam and a second end of each of said moving bars having a guiding structure, a pair of moving grooves being disposed between said first end and said second end, at least a pair of rollers being disposed in each of said platforms of said door and each of said rollers being embedded in each of said moving grooves of said moving bars, and a locating spring being formed as an integral part of each of said moving bars for controlling the turning of said oval cam to drive each of said moving bars to move to and fro between each pair of said socket holes and said latch holes.

2. The wafer container according to claim 1, wherein said guiding structure is a roller structure.

3. The wafer container according to claim 2, wherein a top pressing piece is further pivotally disposed in each of said platforms of said door and is perpendicular to said roller structure.

4. The wafer container according to claim 3, wherein said top pressing piece is a piece body.

5. The wafer container according to claim 1, wherein said guiding structure has a burnished curved surface.

6. The wafer container according to claim 1, wherein an inclined surface of each of said socket holes is curved.

7. The wafer container according to claim 1, wherein said guiding structure and said moving bars are made of different materials.

8. The wafer container according to claim 1, wherein said first end of each of said moving bars is further disposed with a locating structure and said locating structure is in contact with said oval cam, said locating structure comprising a hollowed-out spring structure and a locating portion.

9. The wafer container according to claim 1, wherein said oval cam is further disposed with a plurality of locating grooves.

10. The wafer container according to claim 1, wherein said two platforms are further disposed respectively with at least a restraint module.

11. A wafer container, comprising a container body, in which a plurality of slots being disposed in said container for supporting a plurality of wafers and an opening being formed on one sidewall of said container body for importing and exporting said plurality of wafers, at least a pair of socket holes being disposed in an edge of said opening of said container body, and a door, having an outer surface and an inner surface, at least a pair of latch holes being disposed in an edge of said door and corresponding to said pair of socket holes, said door being joined with said opening of said container body via said inner surface for protecting said plurality of wafers therein, the characteristic of said wafer container in that:

each of said pair of socket holes in said edge of said opening of said container body has an inner groove with an inclined surface for forming an externally wide and internally narrow groove structure, and a latch component is disposed between said inner surface and said outer surface of said door, said latch component including an oval cam and a pair of moving bars, a first end of each of said moving bars connecting to one of two opposite sides of said oval cam and a second end of each of said moving bars having a guiding structure, a pair of moving grooves being disposed between said first end and said second end, at least a pair of rollers being disposed between said inner surface and said outer surface of said door and each of said rollers being embedded in each of said moving grooves of said moving bars, and a locating spring being formed as an integral part of each of said moving bars for controlling the turning of said oval cam to drive each of said moving bars to move to and fro between each pair of said socket holes and said latch holes.

12. The wafer container according to claim 11, wherein said guiding structure is a roller structure.

13. The wafer container according to claim 12, wherein a top pressing piece is further pivotally disposed in each of said platforms of said door and is perpendicular to said roller structure.

14. The wafer container according to claim 13, wherein said top pressing piece is a piece body.

15. The wafer container according to claim 11, wherein said guiding structure has a burnished curved surface.

16. The wafer container according to claim 11, wherein an inclined surface of each of said socket holes is curved.

17. The wafer container according to claim 11, wherein said guiding structure and said moving bars are made of different materials.

18. The wafer container according to claim 11, wherein said first end of each of said moving bars is further disposed with a locating structure and said locating structure is in contact with said oval cam, said locating structure comprising a hollowed-out spring structure and a locating portion.

19. The wafer container according to claim 11, wherein said oval cam is further disposed with a plurality of locating grooves.

20. The wafer container according to claim 11, wherein two platforms are further disposed respectively with at least a restraint module.

* * * * *